United States Patent [19]
Harvey

[11] Patent Number: 4,992,719
[45] Date of Patent: Feb. 12, 1991

[54] STABLE HIGH VOLTAGE PULSE POWER SUPPLY

[75] Inventor: Robin J. Harvey, Thousand Oaks, Calif.

[73] Assignee: Hughes Aircraft Company, Los Angeles, Calif.

[21] Appl. No.: 383,691

[22] Filed: Jul. 24, 1989

[51] Int. Cl.$^5$ .......................................... H02M 3/335
[52] U.S. Cl. ......................................... 320/1; 307/110; 363/59
[58] Field of Search ....................... 363/16, 59, 60, 61; 307/109, 110; 320/1

[56] References Cited

U.S. PATENT DOCUMENTS

| | | | |
|---|---|---|---|
| 3,666,964 | 5/1972 | Flynn | 320/1 |
| 3,746,881 | 7/1973 | Fitch et al. | 307/110 |
| 3,859,582 | 1/1975 | Kautz et al. | 320/1 |
| 3,881,145 | 4/1975 | Tanigaki | 307/110 |
| 4,405,975 | 9/1983 | Overstreet et al. | 320/1 |
| 4,596,945 | 6/1986 | Schumacher et al. | |
| 4,746,783 | 5/1988 | Shibuya et al. | 320/1 |

OTHER PUBLICATIONS

R. J. Harvey et al., "High Voltage Power Supply Design for the Hughes Mark-II FEL", IECED, vol. 3, Paper 889479, 7/31–8/5/88, pp. 755–757.

Primary Examiner—Peter S. Wong
Attorney, Agent, or Firm—V. D. Duraiswamy; P. M. Coble; W. K. Denson-Low

[57] ABSTRACT

A high voltage stable pulse power supply 10 which includes a first power supply 11, ; a first capacitor 12 ; connected in parallel with the first power supply, a first switch 13 mounted in parallel with the first capacitor 12. The switch 13 selectively connects the first capacitor 12 to a load 14 so that the first capacitor 12 may discharge therethrough. An anti-droop network 15 is connected in series with the first capacitor 12. The anti-droop network 15 cancels droop in the output of the first capacitor 12 as it discharges into the load 14.

In a specific embodiment, the anti-droop network 15 includes an inductive element 42 connected in series with the first capacitor 12 which is charged just prior to the activation of the first switch 13. The inductor 42 provides energy to compensate for the droop in the energy supplied by the first capacitor 12. In a more specific embodiment, the first switch 12 is implemented with a Crossatron switch 31 and a modulating anode electron gun 32 to minimize system control voltages.

The present invention achieves coherent emission in a free electron laser, for long pulses, allowing selection of single modes.

12 Claims, 3 Drawing Sheets

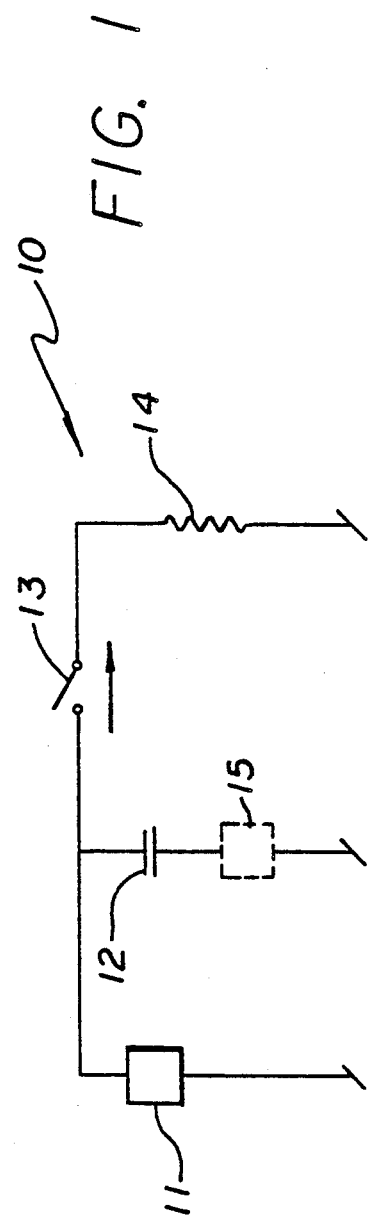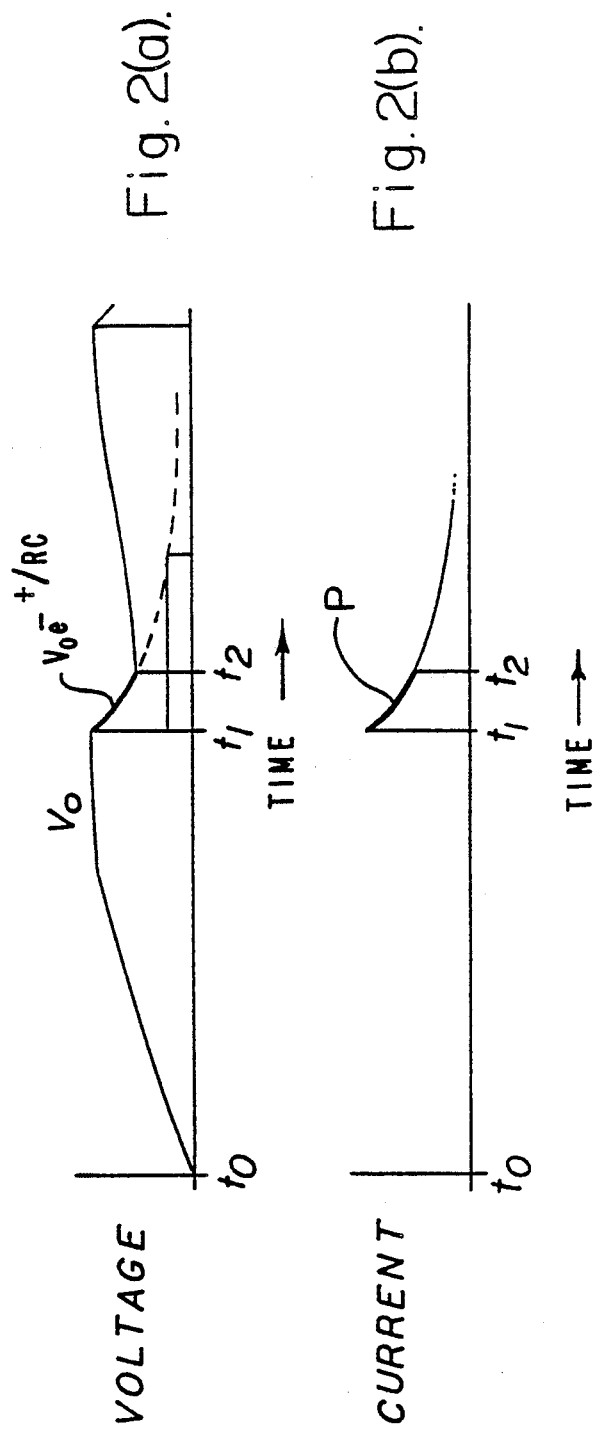

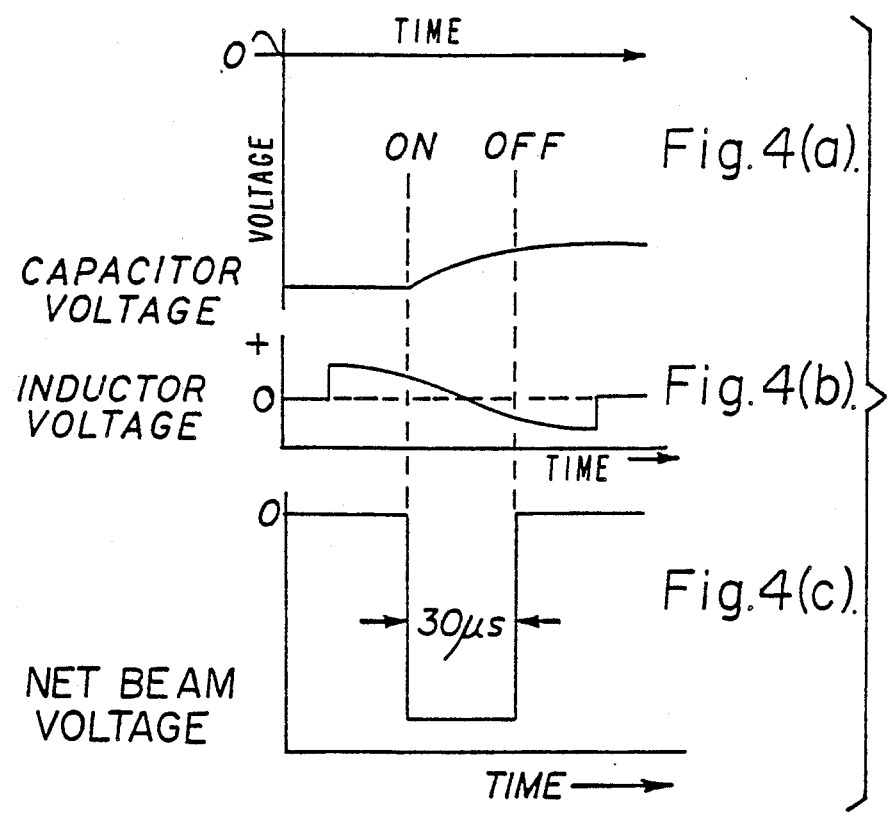
Fig. 4(a).
Fig. 4(b).
Fig. 4(c).
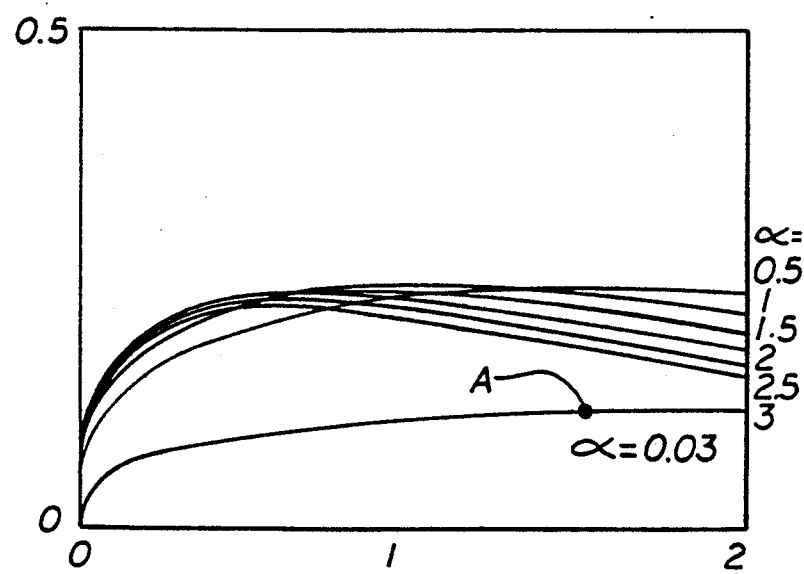
$\epsilon = C1/C2$
FIG. 5

STABLE HIGH VOLTAGE PULSE POWER SUPPLY

BACKGROUND OF THE INVENTION

1. Field of the Invention

The present invention relates to power supplies. More specifically, the present invention relates to high voltage power supplies for free electron lasers and other devices.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Certain devices require a stable high voltage power supply for proper operation. A free electron laser (FEL) is one such device. An FEL is a device in which a beam of electrons is passed through a spatially varying magnetic field. The magnetic field causes electrons in the beam to "wiggle" and radiate energy. In this device, the high voltage power supply performs the function of accelerating electrons to provide the high energy input electron beam. More specifically, FELs and certain other devices require accurate applied voltages on the order of one part in one thousand. Otherwise the frequency and power gain of these devices change with time and produce undesirable results. Thus, several techniques are known in the art for providing such a high voltage supply. These techniques include radio frequency (RF) linear accelerators, pulse linear accelerators, transformers, and Marx banks.

In RF linear accelerators, electrons in a beam are accelerated by an oscillatory field provided by standing electromagnetic waves (microwaves) in a series of cavities. This technique works best for the electrons which enter the cavity at precisely the right time. As a consequence, the accelerated beam is a series of pulses of short duration, i.e., shorter than a microwave period. Unfortunately, the FEL is typical of those applications in which a more steady state electron flow is required to produce free electron lasing interaction on more of a steady state basis.

Pulse linear accelerators have a transformer which steps up a voltage and applies this voltage to an electron beam accelerator. The voltage is often stepped up in series so pulses of electrons are accelerated by a series of structures. Unfortunately, these devices also do not generally supply constant pulses of long duration.

It is possible to operate certain devices at lower voltages using transformers. However, transformers operating at high voltages have difficulty with respect to the voltage time product. That is, the duration at which a high voltage is sustainable is limited by the nature of the transformer. Increases in sustainable pulse lengths come at a cost in terms of transformer size and weight. Output pulse length can not therefore be arbitrarily increased.

Nonetheless, transformers have several features which allow for some degree of trade off in design. Typically the tradeoff comes down to pulse rise time versus pulse flatness. Unfortunately, certain devices, such as the FEL, are designed to operate at a specific voltage. When the transformer is initially turned on, before reaching the operating range of the device, the voltage rises through some range in which the device may experience undesirable and perhaps damaging effects. Accordingly, in FEL and other applications, it is not desirable to initiate a pulse with a long rise time as the electron beam will not be properly focused during the rise of the pulse.

A Marx bank is a set of capacitors switched from a parallel configuration, in which the capacitors are charged, to a series configuration from which the stored voltage is discharged. Essentially, a capacitor is driving the device. While this may be the currently preferred approach, there is a significant problem associated therewith. That is, as the sustainability of the output pulse is defined by the resistive-capacitive (RC) time constant of the device, long steady pulses require long RC time constants. Thus, the extent to which the supply voltage can be sustained at the desired steady state level is dependent on the capacitance of the bank. Unfortunately, as the capacitance of the bank goes up, the hazards associated with the operation of the device go up due to the relationship between the energy stored and capacitance.

Thus, there is a need in the art for a safe, stable, constant voltage, constant current power supply or modulator for operating devices, such as free electron lasers, at voltages of 100 kilovolts or more with pulse durations of tens of micro-seconds.

SUMMARY OF THE INVENTION

The need in the art is addressed by the present invention which achieves coherent emission in an FEL for long pulses allowing selection of single modes not possible or practical with other devices. The high voltage stable pulse power supply of the present invention includes a first power supply, a first capacitor connected in parallel with the first power supply, a first switch mounted in parallel with the first capacitor for selectively connecting the first capacitor to a load so that the first capacitor may discharge therethrough; and an anti-droop network connected in series with the first capacitor for canceling droop in the output of the first capacitor as it discharges into the load.

In a specific embodiment, the anti-droop network includes an inductive element connected in series with the first capacitor which is charged just prior to the activation of the first switch. The inductor provides energy to compensate for the droop in the energy supplied by the first capacitor. In a more specific embodiment, the first switch is implemented with a Crossatron switch and a modulating anode electron gun to minimize system control voltages.

BRIEF DESCRIPTION OF THE DRAWINGS

FIG. 1 is a simplified schematic diagram of a high voltage power supply system.

FIGS. 2A and 2B are representative of the voltage across the capacitor of the high voltage power supply system of FIG. 1.

FIG. 4(a) illustrates the voltage across the capacitor of the high voltage power supply system of FIG. 3.

FIG. 4(b) illustrates the voltage across the inductor of the anti-droop network of the high voltage power supply system of FIG. 3.

FIG. 4(c) illustrates the net beam voltage provided by the high voltage power supply system of the present invention.

FIG. 5 is a graph of the utility factor of the present invention as a function of the ratio of C1 to C2.

DESCRIPTION OF THE INVENTION

Figure 3:
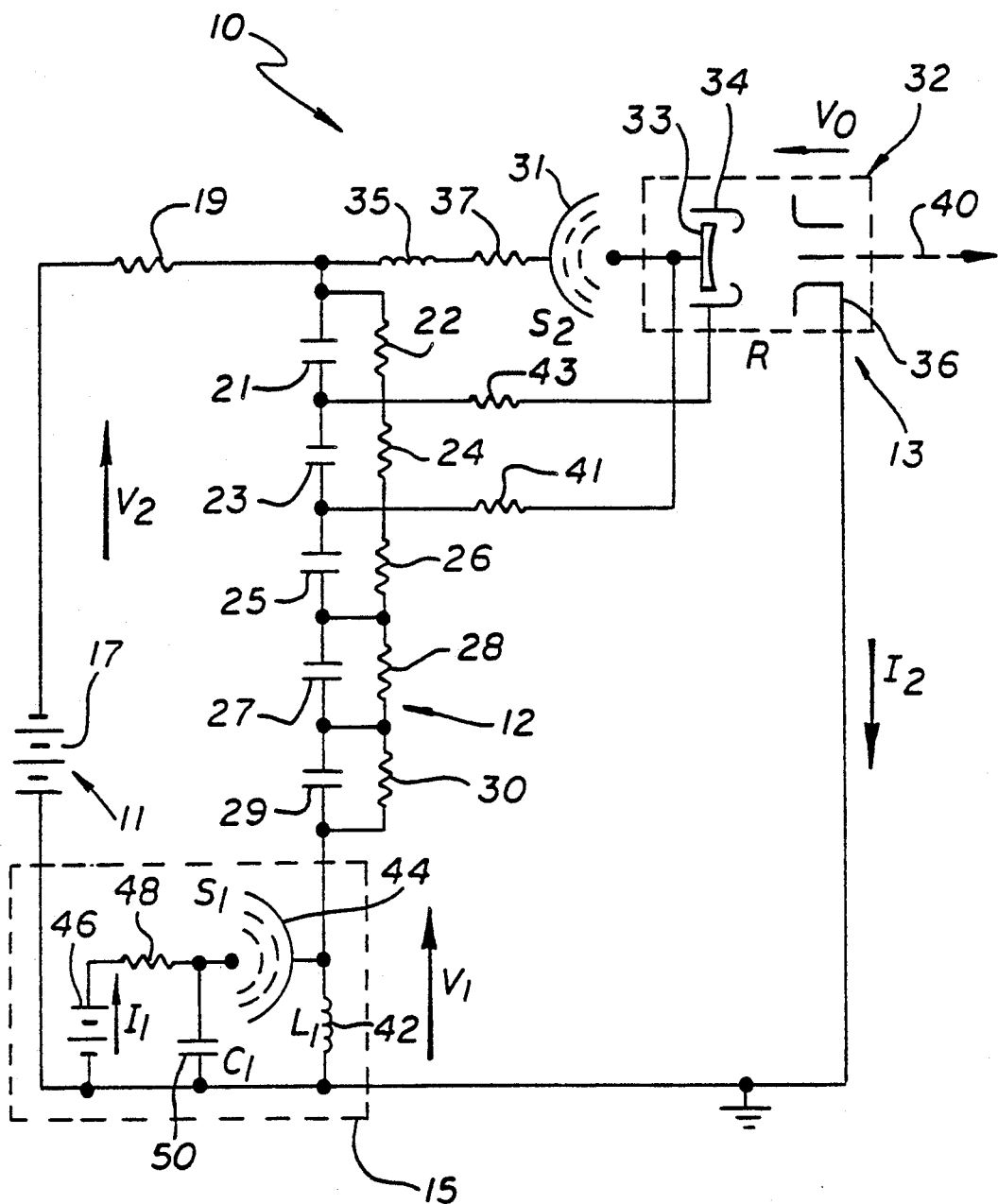
FIG. 3 is a detailed schematic diagram of the high voltage power supply system of the present invention.

Illustrative embodiments and exemplary applications will now be described with reference to the accompanying drawings.

FIG. 1 shows a simple high voltage pulse power supply system 10 including a dc power supply 11 in parallel with a bank of capacitors shown as a single capacitor 12. The power supply 11 and the capacitor 12 are in parallel with a series arrangement of a switch 13 and a resistive load 14. As illustrated in FIG. 2, at time $t_o$, the switch 13 is open and the power supply 11 charges the capacitor 12 to a point of equilibrium at which the voltage on the capacitor settles at some voltage $V_o$. At this time, $t_1$, the switch 13 is closed and power is provided to the load 14 via the discharge of the capacitor 12. The voltage across the capacitor 12 decays and the current through the switch 13 rises in proportion to the voltage applied to the load 14. The result is the application of a pulse to the load 14 is completed, at time $t_2$, when the switch 13 is opened.

As is evident from FIG. 2, the longer the RC time constant, the flatter the pulse P (defined as the curve between $t_1$ and $t_2$). With the opening of the switch 13, the capacitor 12 begins to recharge and the operation is repeated. Thus, a sequence of pulses is delivered to the load 14 by which a current and a voltage would be applied for some duration. The applied voltage $V_L$ would fall at a rate determined by the RC time constant of the capacitor and the load 14 as given by equation [1] below:

$$V_L = V_o e^{-t/RC} \quad [1]$$

If the pulse duration is short relative to the time constant RC, then $$V_L \approx V_o(1 - t/RC) \quad [2]$$

The droop, that is, the error in the voltage during the pulse $\Delta$, may then be estimated as follows:

$$\Delta V_L/V_o = t/RC \quad [3]$$

The object of the invention is to correct for the droop in the pulse P of FIG. 2. This is accomplished by the anti-droop network 15 of the present invention which, as shown in phantom in FIG. 1, is located, for convenience, in the path of the capacitor 12. In the preferred embodiment, the anti-droop network 15 is located near ground potential so that it can be operated without serious hazard and without additional circuit elements to isolate it from ground. As discussed more fully below, the anti-droop network 15 supplies a voltage which substantially cancels the droop in the capacitor voltage due to the RC effect.

FIG. 3 is a schematic diagram of a preferred embodiment of the system 10 with the anti-droop network 15. The power supply 11 is implemented with a dc power supply 17 and a charging resistor 19. In the illustrative embodiment, the power supply 11 is a 400 kV (kilovolt) power supply. The charging resistor 19 is connected to the top of the capacitor bank 12.

The capacitor bank is implemented with a series of capacitors 21, 23, 25, 27 and 29. Plural capacitors are used to allow for the use of capacitors which are somewhat readily available. The capacitors are typically on the order of 100 kV in size. Thus, in the illustrative embodiment, the bank 12 would provide a 0.1 $\mu f$ capacitor rated at 500 kV. By way of example, the bank 12 would be used to operate an FEL with a nominal requirement of 120 kV. In an alternate mode, the capacitor bank may be replaced by a conventional Marx bank.

Each capacitor in the bank 12 has an associated charging resistor 22, 24, 26, 28 and 30. The resistors provide a voltage divider network from which taps may be taken as appropriate for a given application. The resistors divide the supply voltage between the capacitors equally and provide a sustaining voltage for an electron gun 32 in the OFF state thereof. Those skilled in the art will appreciate that devices other than the capacitor bank (such as a Marx bank) may be used without departing from the scope of the invention.

In the preferred embodiment, the switch 13 is implemented with a Crossatron modulator 31 and the electron gun 32. Crossatron modulators are known in the art. See U.S. Pat. No. 4,596,945 issued June 24, 1986 to R. Schumacher and R. Harvey. As described in the referenced patent, Crossatron modulators switch into the ON state with the application of a signal having a predetermined voltage level. The Crossatron modulator 31 is used to switch the controlling voltages at the electron gun 32 and adjust the pulse length thereof. An inductor 35 and a resistor 37 are mounted in series with the Crossatron modulator 31 as is known in the art. In the preferred embodiment, the electron gun 32 is a modulating-anode type electron gun. The electron gun 32 includes a cathode 33 circumscribed by a first annular anode 34. As is known in the art, a second annular anode 36 is included within the electron gun which is displaced and oriented relative to the cathode 33 to attract electrons emitted thereby. The switch 13 is turned on and off, thereby turning on and off the voltage applied to the cathode 33 of the electron gun 32 relative to the modulating-anode 34. The voltages required to set the control levels are taken from the Marx bank 12 through first and second tap resistors 41 and 43 respectively. That is, a bias voltage is applied to the cathode 33 by a first tap from the Marx bank 12 via the first tap resistor 41 while the voltage on the modulating-anode 34 is provided by a second tap from the Marx bank 12 via a second tap resistor 43.

The electron gun 32 operates as a gridded triode vacuum tube in that the electrons are emitted from the cathode surface as the cathode is typically a thermionic cathode at high temperature. The electrons are accelerated across the electron gun toward the anode 36 by the presence of a high electric field. As the anode 36 is annular, the electrons pass through the anode 36 and out the other side thereof as an electron beam 40. The electron beam 40 would then power a free electron laser or other device (not shown).

The potential of the modulating-anode 34 affects the flow of electrons. Hence, the modulating-anode 34 can turn the electron gun 32 on or off depending on the potential applied thereto relative to the potential applied to the cathode 33. The modulating anode feature allows the electron beam current to be controlled with a voltage change of ±10% of the total voltage. Normally, the electron beam of such an electron gun is cut off by holding the modulating anode at a voltage which is larger in magnitude than the potential of the cathode, then pulsing its voltage to an intermediate value between the cathode and the main anode in order to draw current. This requires the power supply to provide approximately 10% more voltage to the modulating anode than the electron gun actually needs to operate. This is problematic in high voltage applications where the voltage approaches the arcing threshold of the electron gun and the circuit.

In the preferred embodiment of the present invention, the potential applied to the cathode 33 is controlled by the Crossatron modulator 31. In this manner, the Crossatron modulator 31 maximum voltage may be less than the voltage it would otherwise be required to handle, e.g., 100 kV. The cathode 33 is held below the magnitude of the modulating anode 34 in the off state, then the cathode 33 is pulsed to its conduction value to draw current. This allows the maximum DC (OFF-state) voltage to be only 90% of the pulsed ON state voltage. The maximum voltage of the electron gun is typically on the order of 400 kV. Hence the circuit can be controlled with a device (the Crossatron modulator), operating at a low voltage relative to the electron gun, which can modulate the pulse width of the output pulse.

The advantageous use of a Crossatron modulator 31 to control the cathode 33 of a modulating-anode electron gun 32 provides a "cathode modulating Crossatron switch" implementation of the switch 13. The cathode modulating switch of the present invention is capable of high voltage pulse modulation in a manner not shown by conventional high voltage switching devices. Nonetheless, the invention is not limited to the illustrative embodiment of the switch 13. Other arrangements may be used without departing from the scope of the invention. For example, the Crossatron modulator may be used to control the voltage on the modulating-anode 34 instead of the cathode 33. This arrangement might have offer marginally improved system stability. However, it might have a disadvantage in that the maximum operating voltage of the circuit would have to be higher to keep the electron gun 32 in the off state. This would present the above noted greater risk of arcing and other hazards.

Further, as is known in the art, with certain conventional approaches to high voltage power supply, e.g., a pulse transformer or the operation of a Marx bank without a switch 13, the voltage would rise through a region at which the electron beam would not have enough energy to pass through the wiggler magnets of the FEL. The electrons in the beam would typically strike the walls of the chamber of the FEL and have certain plasma forming deleterious effects on the device. Hence, another advantage of the preferred embodiment of the present invention is that as the electron beam is rising in potential, the energy in the electron beam is close to its final value. As it would not have a very low value at any time, it should always have the potential to pass through the wiggler field of the free electron laser.

The capacitance of the main capacitor 12 (C2) and the corresponding current through the main anode 36 (I2) determine the rate of fall of the voltage V2, or the droop, during the pulse. That is, typically:

$$dV2/dt = -I2/C2 = -1 \, kV/\mu s \quad [1]$$

where V2 is the voltage across the capacitor bank C2. Since the voltage change must be limited to control the frequency of a device such as an FEL, the pulse length is limited by the capacitance. It is not desirable to add to the capacitance. The energy stored in the 400 kV capacitor bank 12 of the illustrative embodiment is approximately 8 kJ (kilojoules). This value is believed to be the upper safe limit, particularly from the point of view of the arc currents which can damage the electron gun 32. Also, the size and weight of the capacitor 12 scales with the capacitance thereof and designs using a minimum of capacitance are best from a system point of view.

As mentioned above, the purpose of the anti-droop network 15 is to provide an equal and opposite potential to cancel a decline in the cathode potential. Hence, the anti-droop network must provide a rising voltage at the cathode 33 of the electron gun 32. In actuality, inasmuch as cathodes operate with negative voltages with respect to ground potential, the capacitor bank is oriented such that the voltage on the cathode rises as shown in FIG. 4(a). Thus, technically, the anti-droop network 15 must provide a voltage that decays to cancel the rise in the cathode voltage.

As shown in FIG. 3, the anti-droop network 15 includes an inductor 42 mounted in the path of the capacitor bank 12. A second Crossatron modulator switch 44 selectively connects a circuit including a second power supply 46, charging resistor 48 and capacitor 50 to the inductor 42. The capacitor 50 is mounted in parallel with the series connection of the power supply 46 and the resistor 48. In operation, first, the main capacitor bank 12 and the capacitor 50 in the anti-droop network 15 are charged. Then the switch 44 in the anti-droop network 15 is fired and a current rises in the inductor 42 to a peak level. (This could be performed by any current source driving the inductor and the switch need not be a Crossatron modulator switch. For example, a thyratron may be used.) The values of the capacitor 50 of the anti-droop network, the inductor 42, and the initially inverted charging voltage on the capacitor 50 (V1) are chosen so that once the current in the inductor 42 has reached its desired value (I0) the anti-droop capacitor 50 has nearly fully discharged. This means that the current in the inductor is nearly equal to the desired load current, the voltage V1 is rising across the inductor 42 and the system is ready for the electron gun 32 to be activated. At this point, the electron gun 32 is activated.

As is evident in FIG. 4, the voltage $V_1$ across the inductor 42 of the anti-droop network 15 does not produce a waveform having exactly the same shape as that of the capacitor voltage $V_2$. However, there is some curvature and by proper timing, the curvature and droop of the waveform of the inductor voltage of the anti-droop network may be made to cancel that of the cathode voltage. The result is that the apparent voltage applied to the electron beam and the current therethrough are constant (assuming a linear resistive load). The anti-droop network 15 takes advantage of the fact that an inductor attempts to maintain constant current. Accordingly, when an attempt is made to turn off the current through an inductor, the voltage drop across the inductor rises and the inductor attempts to compensate for the loss of current.

The power supply 46 and the capacitor 50 establish a current in the inductor 42 which is equal to the desired current flow in the electron gun 32. Thus, when the capacitor voltage begins to droop and the capacitor voltage begins to fall, the energy from the inductor 42 will be supplied to keep the voltage up longer. The capacitance $C_1$ of the capacitor 50 is chosen, as discussed below, relative to the capacitance $C_2$ of the capacitor bank 12 to provide proper timing for the switching of the second Crossatron switch 44 and, hence, the activation of the anti-droop network 15. That is, by adjusting the timing of the second Crossatron switch 44 and the voltage applied to the anti-droop capacitor 50, the amount of compensation, i.e., the slope and curvature provided by the network 15, the shape and the total amplitude may be adjusted.

In accordance with the teaching of the above-noted reference, the second Crossatron switch 44 would be triggered by a pulse transformer (not shown). The pulse transformer would be connected to a system control unit (not shown). The system control unit would provide timing and control signals for both switches 31 and 44 in accordance with the above-noted teachings.

When the second Crossatron switch 44 is closed, the voltage applied to the capacitor 50 will cause a current to flow through the inductor 42. The current in the inductor 42 will flow first in a forward direction toward ground until the capacitor 50 is discharged. Thereafter, the current in the inductor 44 continues to flow in the same direction as the capacitor $C_1$ recharges in the opposite polarity. When the capacitor is fully discharged, at the mid point, there is no voltage across the inductor 42 but there is current flowing in the inductor 44. At that instant of time, the inductor 44 will tend to charge the capacitor 50 in the opposite direction. The voltage across the capacitor 50 will rise at some rate. By adjusting the rate of rise of the voltage across the capacitor 50 to equal the decline in the magnitude of the voltage across the Marx bank, the droop in the voltage thereof may be canceled.

The anti-droop network 15 mitigates the need for larger values of the capacitance $C_2$ of the capacitor bank 12 by providing a linear ramp function voltage which is added between the capacitor bank 12 and ground. The slope of the compensating pulse is adjusted to cancel the droop to one part in 200 for a time of up to 30 $\mu s$, which is consistent with the laser requirements.

The following discussion demonstrates that first and second order effects can be canceled using the teachings of the present invention leaving only third order effects which may be assumed to be small for pulses of reasonable duration. This analysis shows that once the electron gun 32 is activated, the current in the inductor finds its return path through the resistance of the electron gun 32 and the main capacitor 12, and the current I1 in the anti-droop switch 44 falls to zero. The pertinent equations at this instant are:

$$I1 = -C1 dV1/dt \quad [2]$$

$$I2 = -C2 dV2/dt \quad [3]$$

$$RI2 = V1 + V2 \quad [4]$$

$$V1 = Ld(I1 - I2)/dt \quad [5]$$

where R is the resistance across the electron gun 32 and L is the inductance of the inductor 42. Equations 2–5 can be written in terms of the current I2 as:

$$RC1\partial^3 I2/\partial t^3 + (1+C1/C2)\partial^2 I2/\partial t^2 + R\partial I2/L\partial t + I2/LC2 = 0 \quad [6]$$

Stable conditions are found when the initial conditions are approximately given by equations [7] through [10] below:

$$I1(0) = -C1 I0/C2 \quad [7]$$

$$I2(0) = I0 \quad [8]$$

$$V1(0) = 0 \quad [9]$$

$$V2(0) = I0 R \quad [10]$$

Hence, the solution can be approximated to third order as:

$$I2 = I0[1 - (t/\tau)^3] \quad [11]$$

where $$\tau = (6RC1C2L)^{\frac{1}{3}} \quad [12]$$

and where $\tau$ represents the characteristic time over which the current and voltage change and t is the time measured relative to the center of the pulse. Typically, it is desired to provide a time $\Delta t = T$ of the order of 20 $\mu s$ during which the change in the current is less than 0.1% or $\Delta I2/I2 = (|t|/\tau)^3 < 10^{-3}$ or $-0.1\tau < t < 0.1\tau$. Giving a relationship for the times $T = 0.2\tau$ or $\tau = 100 \mu S$. Since R and $C_2$ are generally fixed by the system it becomes necessary to optimize the choice of L and $C_1$ to achieve the necessary time constants. The initial energy stored in the circuit is given by:

$$\begin{aligned} E_c &= L/2(I1 - I2)^2 + 1/2C2V_o^2 \\ &= L/2(1 + C1/C2)^2 I_o^2 + C2I_o^2 R^2 \end{aligned} \quad [13]$$

and the energy used in the load is given by:

$$E_1 = RI_o^2 T = 0.2 R I_o^2 (6RC1C2L)^{\frac{1}{3}} \quad [14]$$

where T is the pulse length. The "Utility factor," $T = E1/E_c$, is defined in this application as a measure of the energy used by the load in a single pulse relative to the energy that must be stored by the system. It represents in an approximate but practical manner the utility of the system due to its relative system size, cost, weight or safety hazard, (it is not true electrical efficiency). This utility factor is evaluated from equations 13 and 14 and is given by:

$$\eta = 0.4(6\alpha\epsilon/8)^{\frac{1}{3}}/(\alpha/8)(1+\epsilon)^2 + 1] \quad [15]$$

and is maximized when the parameters $\epsilon = C1/C2$ and $\alpha = 8L/C2R^2$ (defined hereby) both equal unity. Under these conditions $\eta$ is approximately 24.2% in the illustrative embodiment. The equivalent utility factor computed for a conventional capacitive discharge circuit is by comparison only 0.2% and approximately 60 times more energy is needed to be stored in the primary capacitor to achieve the same 0.1% pulse flatness for the same duration. The maximum utility factor values derived above can require a large driving voltage for the compensating network. As indicated in FIG. 5, the cube-root dependence of the utility factor $\eta$ allows for a considerable variation in parameters without suffering a major loss of utility factor. For example, by reducing the inductance L, and increasing the value of C1, the initial charging voltage $V1(-\infty)$ can be lowered to a modest level, relative to $V_o$. A significant increase in stable pulse length, T, can also be obtained by simply detuning $V_1$ from the initial conditions, noted above, and allowing for a slight excess compensating slope in the load voltage at the middle of the pulse. Consideration must also be made for resistive losses in the actual circuit elements. Typical circuit values actually used in the preferred embodiment (corresponding to the data point "A" shown FIG. 5 are:

$C1 = 0.15 \mu F$ $C2 = 0.1 \mu F$ $R = 5000 \Omega$ $L = 9$ mH $I_o = 50$ A $V_o = 250,000 V$ $V_1(-\infty) = 18,000 V$ These values give a calculated utility factor of $\eta = 12\%$ and a measured stable pulse length of 30 $\mu s$ during which the voltage variation is less than 250 V.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. A high voltage stable pulse power supply comprising:
    a first power supply;
    first capacitive means connected in parallel with said power supply for storing a charge provided thereby;
    first switch means mounted in parallel with said first capacitive means for selectively connecting said first capacitive means to a load so that said first capacitive means may discharge therethrough; and
    anti-droop network means connected in series with said first capacitive means for canceling droop in the output of said first capacitive means as said first capacitive means discharges into said load, said anti-droop network means including an inductor mounted in series with said first capacitive means.

2. The invention of claim 1 wherein said anti-droop network means includes second capacitive means mounted in parallel with said inductor for discharging a stored charge therethrough.

3. The invention of claim 2 wherein said anti-droop network means includes a second power supply mounted in parallel with said second capacitive means and second switch means for selectively connecting said second capacitive means to said inductor.

4. The invention of claim 1 wherein first switch means includes a modulating anode electron gun.

5. The invention of claim 4 wherein said modulating anode electron gun includes a cathode, a first modulating anode and a second anode.

6. The invention of claim 5 wherein said modulating anode is mounted about the periphery of said cathode.

7. The invention of claim 7 wherein said first switch means further includes a Crossatron switch connected between said first capacitive means and said cathode of said electron gun.

8. The invention of claim 5 wherein said first capacitive means is a capacitor bank, said cathode being connected to a first tap thereof and said modulating anode being connected to a second tap thereof.

9. A high voltage stable pulse power supply comprising:
    a first power supply;
    first capacitive means connected in parallel with said first power supply for storing a charge provided thereby;
    first switch means mounted in parallel with said first capacitive means for selectively connecting said first capacitive means to a load so that said first capacitive means may discharge therethrough, said first switch means including a modulating anode electron gun having a cathode, a modulating anode, and a second anode connected to said load, said first switch means further including a Crossatron modulator switch connected between said first capacitive means and said cathode of said electron gun; and
    anti-droop network means connected in series with said first capacitive means for canceling droop in the output of said first capacitive means as said first capacitive means discharges into said load, said anti-droop network means including:
    an inductor mounted in series with said first capacitive means,
    a second capacitive means mounted in parallel with said inductor for discharging a stored charge therethrough, and
    a second power supply mounted in parallel with said second capacitive means and second switch means for selectively connecting said second capacitive means to said inductor.

10. In a high voltage pulse power supply having a power supply, a first capacitor connected in parallel with said power supply and a first switch for selectively connecting said capacitor across a load to allow said capacitor to discharge into said load, a method for canceling droop in the output of said capacitor during the discharge thereof including the steps of:
    (a) connecting an anti-droop network in series with said capacitor, said network including an inductor connected in series with said first capacitor, a second power supply and a second capacitor in parallel with said inductor and a second switch between said capacitor and said inductor;
    (b) charging the first capacitor;
    (c) charging the second capacitor;
    (d) activating said second switch to allow said second capacitor to discharge through said inductor; and
    (e) activating said first switch to allow said first capacitor to discharge through said load.

11. The invention of claim 10 including the step of activating said first switch when said second capacitor has substantially discharged into said inductor.

12. A high voltage stable pulse power supply comprising:
    a first power supply;

first capacitive means connected in parallel with said power supply for storing a charge provided thereby;

first switch means mounted in parallel with said first capacitive means for selectively connecting said first capacitive means to a load so that said first capacitive means may discharge therethrough; and anti-droop network means connected in series with said first capacitive means for canceling droop in the output of said first capacitive means as said first capacitive means discharges into said load, said anti-droop network means including means for providing inductance.

* * * * *

UNITED STATES PATENT AND TRADEMARK OFFICE
CERTIFICATE OF CORRECTION

PATENT NO. : 4,992,719
DATED : February 12, 1991
INVENTOR(S) : ROBIN J. HARVEY

It is certified that error appears in the above-identified patent and that said Letters Patent is hereby corrected as shown below:

In the Abstract, line 2, delete ";" first and second occurrence.

Col. 10, line 56, after "said" first occurrence, insert --second--.

Signed and Sealed this

Second Day of November, 1993

Attest:

BRUCE LEHMAN

Attesting Officer      Commissioner of Patents and Trademarks